(12) United States Patent
Zang et al.

(10) Patent No.: US 7,448,002 B2
(45) Date of Patent: Nov. 4, 2008

(54) INSPECTION SYSTEM

(75) Inventors: Linkke Zang, Taipei (TW); Bg Fan, Taipei (TW)

(73) Assignee: Inventec Corporation (TW)

( * ) Notice: Subject to any disclaimer, the term of this patent is extended or adjusted under 35 U.S.C. 154(b) by 314 days.

(21) Appl. No.: 11/378,131

(22) Filed: Mar. 17, 2006

(65) Prior Publication Data

US 2007/0220463 A1    Sep. 20, 2007

(51) Int. Cl.
*G06F 17/50*    (2006.01)
(52) U.S. Cl. .............................. 716/4; 716/11; 716/12; 716/18; 716/19
(58) Field of Classification Search ..................... 716/2, 716/11, 12, 18, 19
See application file for complete search history.

(56) References Cited

U.S. PATENT DOCUMENTS 5,883,437 A * 3/1999 Maruyama et al. .......... 257/773

* cited by examiner

*Primary Examiner*—Thuan Do
(74) *Attorney, Agent, or Firm*—Peter F. Corless; Steven M. Jensen; Edwards Angell Palmer & Dodge LLP

(57) ABSTRACT

An inspection system applicable to a data processing device installed with a PCB (printed circuit board) design software and a display unit is proposed, wherein the PCB design software is used for creating PCB totems for a multi-layer PCB, the display unit is used to display an user interface provided by the PCB design software in top view projection, the user interface comprising a plurality of wires and a plurality of planes for specific uses. The inspection system of the present invention first stores information of planar coordinate ranges of the planes respectively corresponding to the wires allowed to be routed thereon in a database. Then, through a coordinate range acquiring module, wire coordinate ranges and planar coordinate ranges corresponding to the plurality of wires on the user interface are acquired each time when a user operates the user interface. Subsequently, a comparing module determines whether each of the wire coordinate ranges only corresponds to one of the planar coordinate ranges, if no, an alerting signal is outputted, otherwise, if each of the wire coordinate ranges corresponds to only one of the planar coordinate ranges, the comparing module further determines whether each of the planar coordinate ranges corresponding to a wire coordinate range is located inside a corresponding planar coordinate range stored in the database, if no, an alerting signal is outputted. Finally, through a display control module, the wires corresponding to the wire coordinate ranges that do not meet the above mentioned conditions are displayed on the display unit of the data processing device according to the alert signal in a predefined way for purpose of inspection.

11 Claims, 1 Drawing Sheet

US 7,448,002 B2

INSPECTION SYSTEM

BACKGROUND OF THE INVENTION

1. Field of the Invention

The present invention relates to an inspection system, and more particularly to an inspection system applied to a data processing device installed with a PCB (printed circuit board) design software and a display unit, wherein the PCB design software is used for creating PCB totems for a multi-layer PCB, an user interface provided to a user by the PCB design software is displayed on the display unit in top view projection and the user interface comprises a plurality of wires and a plurality of planes for specific uses.

2. Description of Related Art

With the development of electronic technology, EDA (electronic design automatic) tools such as PCB design softwares for creating PCB totems are being provided with more and more functions. For example, during a PCB totem design for a multi-layer PCB, most of important signal wires are usually electrically connected to a plane of an adjacent layer such as a power plane or a ground plane. Meanwhile, each of the signal wires in top view is located inside the range of the plane to which the signal wire is electrically connected.

Conventionally, a user needs to manually route and check wires according to the above design rules during a PCB totem design. However, using this method, it often occurs that some signal wires do not meet the above design rules due to carelessness of the user, thereby increasing the complex of the subsequent inspection procedures and decreasing the product yield.

Further, during the subsequent inspection procedures, the layout is only checked with naked eyes, which not only requires time and labor, but also is easy to lead to high error rate. Particularly, such a checking method is difficult to meet the requirement of current PCBs which have much higher density structure.

Accordingly, there is a need to develop an inspection technology which can overcome the above defects.

SUMMARY OF THE INVENTION

According to the above defects, an objective of the present invention is to provide an inspection system for routing inspection.

Another objective of the present invention is to provide an inspection system which can avoid problems such as planes in non-adjacent layers being electrically connected by a wire, or a wire in top view being not located inside the plane electrically connected to the wire.

To achieve the above and other objectives, the present invention proposes an inspection system applicable to a data processing device installed with a PCB (printed circuit board) design software and a display unit, wherein the PCB design software is used for creating PCB totems for a multi-layer PCB, the display unit is used to display an user interface provided by the PCB design software in top view projection, the user interface comprising a plurality of wires and a plurality of planes for specific uses. The inspection system of the present invention comprises a database for storing planar coordinate ranges of the planes respectively corresponding to the wires allowed be routed thereon; a coordinate range acquiring module for acquiring wire coordinate ranges and planar coordinate ranges corresponding to the plurality of wires on the user interface each time when a user operates the user interface; a comparing module for receiving the wire coordinate ranges and planar coordinate ranges acquired by the coordinate range acquiring module each time when a user operates the user interface, and determining whether each of the wire coordinate ranges only corresponds to one of the planar coordinate ranges, if no, an alerting signal is outputted, otherwise, if each of the wire coordinate ranges corresponds to only one of the planar coordinate ranges, the comparing module further determining whether each of the planar coordinate ranges corresponding to a wire coordinate range is located inside a corresponding planar coordinate range stored in the database, if no, an alerting signal is outputted; and a display control module which displays the wires corresponding to the wire coordinate ranges that do not meet the above mentioned conditions on the display unit of the data processing device according to the alert signal in a predefined way for purpose of inspection.

DETAILED DESCRIPTION OF PREFERRED EMBODIMENTS

Figure 1:
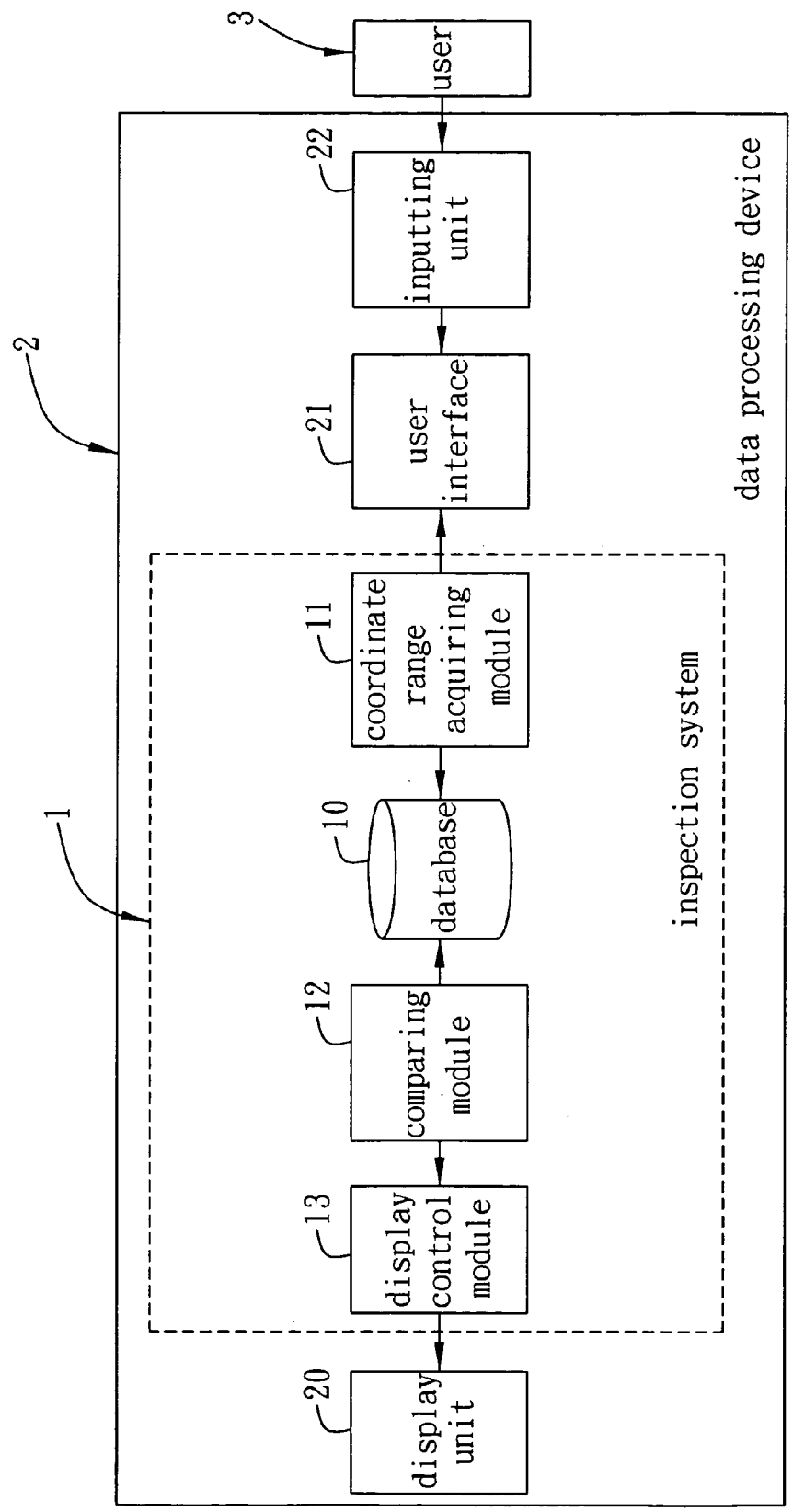
FIG. 1 is a block diagram of an inspection system of the present invention.

Hereunder, embodiments of the present invention will be described in full detail with reference to the accompanying drawings.

FIG. 1 is a block diagram of an inspection system 1 of the present invention. The inspection system 1 can be applied to a data processing device 2 installed with a PCB (printed circuit board) design software for creating PCB totems for a multi-layer PCB. Also, the data processing device 2 is provided with a display unit 20. The PCB design software can provide a user interface 21 in top view projection to a user 3 though the display unit 20, wherein the user interface 21 comprises a plurality of wires and a plurality of planes for specific uses. In the present embodiment, the display unit 20 can be a LCD display, a CRT display or a plasma display. The data processing device 2 can be a desktop computer, a pocket personal computer, a notebook computer, a server or a super computer. The plurality of wires of the user interface 21 refers to signal wires for signal transmission of the PCB totems. Each of the plurality of planes of the user interface 21 refers to a power plane or a ground plane of the PCB totems.

The inspection system 1 of the present invention comprises a database 10, a coordinate range acquiring module 11, a comparing module 12 and a display control module 13.

The database 10 is used to store planar coordinate ranges of the planes respectively corresponding to the wires allowed to be routed thereon. That is, for the planes that allow the wires to be routed thereon such as a power plane and/or a ground plane, position ranges of the planes on the user interface 21 are stored in the database 10. In the present embodiment, the database 10 is a relational database.

The coordinate range acquiring module 11 is used to acquire wire coordinate ranges and planar coordinate ranges corresponding to the plurality of wires on the user interface 21 each time when a user 3 operates the user interface 21. In the present embodiment, a user 3 operates the user interface 21 through an inputting unit 22 of the data processing device 2. The wire coordinate ranges refer to position ranges of the plurality of wires on the user interface 21. The planar coordinate ranges refer to position ranges of the plurality of planes on the user interface 21.

The comparing module 12 is used to receive the wire coordinate ranges and planar coordinate ranges acquired by the coordinate range acquiring module 11 each time when a user 3 operates the user interface 21, and determine whether each of the wire coordinate ranges only corresponds to one of the planar coordinate ranges, if no, an alerting signal is outputted, otherwise, if each of the wire coordinate ranges corresponds to only one of the planar coordinate ranges, the comparing module 12 further determines whether each of the planar coordinate ranges corresponding to a wire coordinate range is located inside a corresponding planar coordinate range stored in the database, if no, an alerting signal is outputted. In the present embodiment, determining whether each of the wire coordinate ranges only corresponds to one of the planar coordinate ranges refers to determining whether the position range of each of the plurality of wires on the user interface 21 is only located inside the position range of one of the plurality of planes on the user interface 21. Determining whether each of the planar coordinate ranges corresponding to a wire coordinate range is located inside a corresponding planar coordinate range stored in the database refers to determining whether the position range of each of the planes corresponding to a wire on the user interface is located inside position range of a plane corresponding to the wire stored in the database.

When the display control module 13 receives an alerting signal from the comparing module 12, the display control module 13 displays the wires corresponding to the wire coordinate ranges that do not meet the above mentioned conditions on the display unit 20 of the data processing device 2 according to the alert signal in a predefined way for purpose of inspection. In the present embodiment, the wires can be displayed by highlighting or displayed by using design rule check (DRC) error reporting method so as to facilitate user inspection.

The inspection system of the present invention can prevent problems such as planes in non-adjacent layers being electrically connected by a wire, or a wire in top view being not located inside the plane electrically connected to the wire, thereby facilitating the subsequent inspection procedures and increasing the product yield.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An inspection system applicable to a data processing device installed with a PCB (printed circuit board) design software and a display unit, wherein the PCB design software is used for creating PCB totems for a multi-layer PCB, the display unit is used to display an user interface provided by the PCB design software in top view projection, the user interface comprising a plurality of wires and a plurality of planes for specific uses, the inspection system comprising:
   a database for storing planar coordinate ranges of the planes respectively corresponding to the wires allowed be routed thereon;
   a coordinate range acquiring module for acquiring wire coordinate ranges and planar coordinate ranges corresponding to the plurality of wires on the user interface each time when a user operates the user interface;
   a comparing module for receiving the wire coordinate ranges and planar coordinate ranges acquired by the coordinate range acquiring module each time when a user operates the user interface, and determining whether each of the wire coordinate ranges only corresponds to one of the planar coordinate ranges, if no, an alerting signal is outputted, otherwise, if each of the wire coordinate ranges corresponds to only one of the planar coordinate ranges, the comparing module further determining whether each of the planar coordinate ranges corresponding to a wire coordinate range is located inside a corresponding planar coordinate range stored in the database, if no, an alerting signal is outputted; and
   a display control module which displays the wires corresponding to the wire coordinate ranges that do not meet the above mentioned conditions on the display unit of the data processing device by using a design rule check (DRC) error reporting method according to the alert signal in a predefined way for purpose of inspection.

2. The inspection system of claim 1, wherein the display unit is one of a LCD display, a CRT display and a plasma display device.

3. The inspection system of claim 1, wherein the data processing device is one of a desktop computer, a pocket personal computer, a notebook computer, a server and a super computer.

4. The inspection system of claim 1, wherein the plurality of wires on the user interface refers to signal wires for signal transmission in the PCB totems.

5. The inspection system of claim 1, wherein each of the plurality of planes for specific uses on the user interface refers to one of a power plane and a ground plane in the PCB totems.

6. The inspection system of claim 1, wherein the database is a relational database.

7. The inspection system of claim 1, wherein the wire coordinate ranges refer to position ranges of the plurality of wires on the user interface.

8. The inspection system of claim 1, wherein the planar coordinate ranges refer to position ranges of the plurality of the planes on the user interface.

9. The inspection system of claim 1, wherein determining whether each of the wire coordinate ranges only corresponds to a planar coordinate range refers to determining whether the position range of each of the wires on the user interface is only located inside the position range of one of the planes on the user interface.

10. The inspection system of claim 1, wherein determining whether each of the planar coordinate ranges corresponding to a wire coordinate range is located inside a corresponding planar coordinate range stored in the database refers to determining whether position range of each of the planes corresponding to a wire on the user interface is located inside position range of a plane corresponding to the wire stored in the database.

11. The inspection system of claim 1, wherein the display control module highlights the wires on the display unit of the data processing device.

* * * * *